United States Patent [19]

Klein

[11] 3,949,395

[45] Apr. 6, 1976

[54] SUCCESSIVE-APPROXIMATION ANALOG-TO-DIGITAL CONVERTER USING JOSEPHSON DEVICES

[75] Inventor: Melvin Klein, Mount Kisco, N.Y.

[73] Assignee: International Business Machines Corporation, Armonk, N.Y.

[22] Filed: Aug. 28, 1974

[21] Appl. No.: 501,121

[52] U.S. Cl............ 340/347 AD; 307/245; 307/277; 307/306
[51] Int. Cl.² ....................................... H03K 13/02
[58] Field of Search ................ 340/347 AD, 173.1; 307/277, 306, 245; 338/32 S

[56] References Cited
UNITED STATES PATENTS

| | | | |
|---|---|---|---|
| 3,050,721 | 8/1962 | Anderson | 340/347 AD |
| 3,259,844 | 7/1966 | Casimir | 307/306 |
| 3,386,089 | 5/1968 | Meiklejohn | 340/347 AD |
| 3,419,712 | 12/1968 | Green | 338/32 S |
| 3,466,470 | 9/1969 | Rowell | 338/32 S |

Primary Examiner—Charles D. Miller
Attorney, Agent, or Firm—Thomas J. Kilgannon, Jr.

[57] ABSTRACT

A comparison means has plural Josephson devices each controlled by an analog input current and an opposing subtraction current. A subtraction means has a series circuit of Josephson devices arranged in groups, each group being switched by one of the comparison devices. The subtraction current is proportional to the number of devices switched in the series circuit. An output means has a string of Josephson devices each providing an output bit from one of the comparison devices. Fixed bias currents control the effective thresholds of the comparison devices.

7 Claims, 3 Drawing Figures

SUCCESSIVE-APPROXIMATION ANALOG-TO-DIGITAL CONVERTER USING JOSEPHSON DEVICES

The invention was made under a U.S. Government Contract DAAB03-73-C-0494.

BACKGROUND OF THE INVENTION

The present invention relates to analog-to-digital (A/D) converters of the successive-approximation type. Such converters have been implemented in many forms. Representative examples are illustrated in, e.g., U.S. Pat. Nos. 3,501,625 to Gorbatenko and 3,626,407 to Drangeid et al. Likewise, superconductive devices, including Josephson tunneling-junction devices, have been employed to implement various types of analog-to-digital converters. U.S. Pat. Nos. 3,204,211 to Crittenden et al. and 3,327,303 to Hughes et al. show A/D converters using cryotrons, and U.S. Pat. No. 3,458,735 shows A/D conversion with Josephson devices. Those structures, however, are relatively complex and do not utilize the full potential of such devices.

SUMMARY OF THE INVENTION

The present invention proposes a successive-approximation A/D converter using a relatively small number of Josephson tunneling junctions in a particularly simple configuration. Another advantage is that no more than three control lines are required for each junction, which eases fabrication and assures that each line will exert a predictable amount of control over its associated junction. For some applications, it is another advantage of the invention that the analog signal is a current rather than a voltage.

Briefly, the present invention proposes a successive-approximation A/D converter using Josephson junctions adapted to switch to a voltage-drop state at predetermined control-signal levels. A comparison means includes a plurality of such junctions, and control line means for applying the analog input signal and a subtraction signal to the comparison junctions. A subtraction means has a plurality of such junctions disposed in groups for producing the subtraction signal. The groups of subtraction junctions are switched as units by respective comparison signals. The subtraction signal represents the number of subtraction devices which have been switched. An output means then produces digital signals representing the analog input.

DETAILED DESCRIPTION OF THE INVENTION

Figure 1:
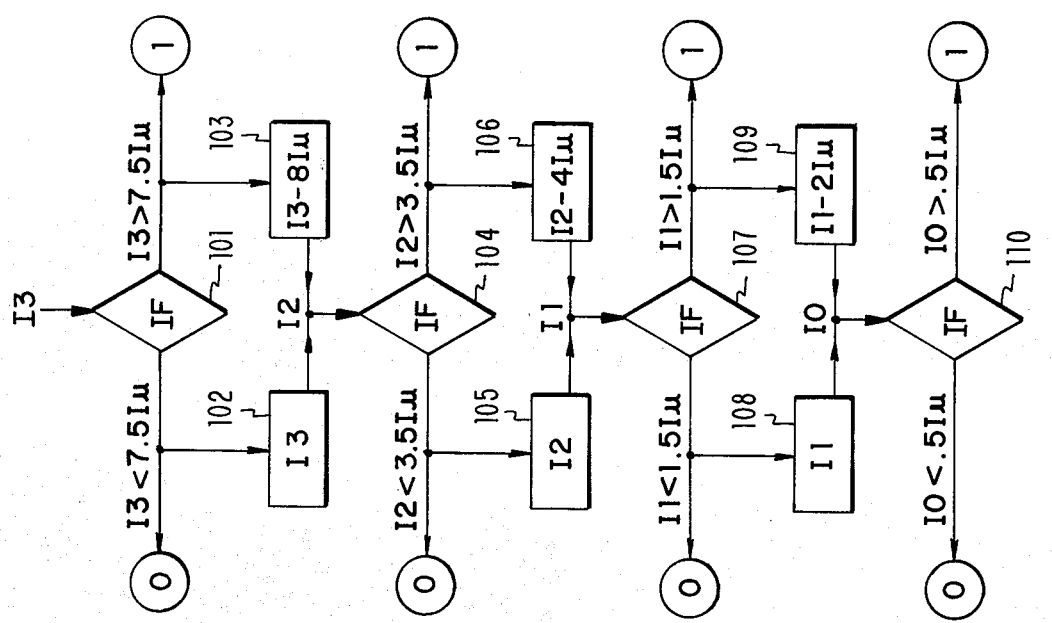
FIG. 1 is a flowchart for demonstrating the basic process of successive-approximation A/D conversion.

FIG. 1 outlines an example of the method of analog/digital conversion by successive approximation. This example will be useful in understanding the novel structure to be presented in FIG. 2.

In FIG. 1, an analog current $I3$ is digitized into four output bits, each representing a binary power multiple of a reference current $Iu$. The first output bit indicates whether or not the input current $I3$ exceeds $2^3 \times Iu$. Therefore, block 101 compares $I3$ with $7.5 \times Iu$, which includes a tolerance of one-half the least significant bit (LSB). If $I3$ does not exceed $7.5 \times Iu$, block 102 produces a current $I2=I3$, and produces a digital 0 for the first output bit. Otherwise block 103 subtracts $2^3 \times Iu$ from $I3$, and produces a digital 1 for the first output bit.

Second-stage decision block 104 compares $I2$ with $2^2 \times Iu$, less a tolerance of $0.5 \times Iu$, or $3.5 \times Iu$. If $I2$ is less than this amount, a digital 0 is produced for the second output bit, and block 105 generates a current $I1=I2$. Otherwise, the second output bit is a 1, and $I1=I2-2^2 \times Iu$, from block 106. In a similar manner, block 107 compares $I1$ with $2^1 \times Iu$, less the tolerance. The third output bit is 0 if $I1$ is less than $1.5 \times Iu$, and block 108 defines $I0=I1$. Otherwise, the third bit is 1 and block 109 generates $I0=I1-2^1 \times Iu$. Finally, decision block 110 compares $I0$ with $2^0 \times Iu$ less the ½ LSB tolerance, or $0.5 \times Iu$. The fourth output bit is 0 if $I0$ does not exceed this threshold, and is 1 otherwise.

Figure 2:
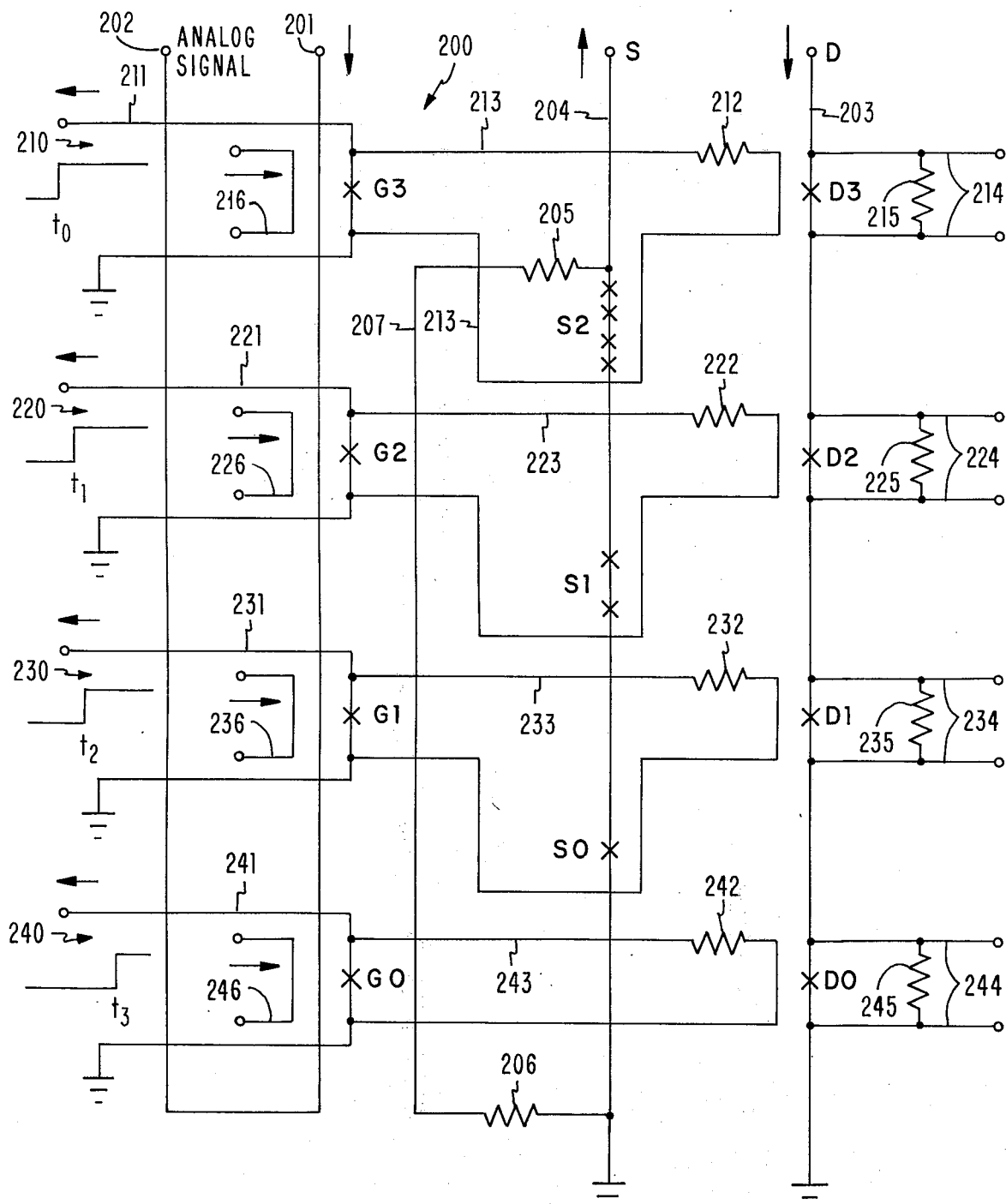
FIG. 2 shows a four-stage A/D converter according to the invention.

FIG. 2 shows a four-stage analog/digital converter 200 employing Josephson devices according to the present invention.

Basically, a Josephson device is a current-driven, voltage-output switch. A tunneling junction (denoted by an $X$ in FIG. 2) between two superconductors switches from zero voltage drop to a constant voltage drop at a predetermined magnetic field strength threshold which, for the present purposes, may be taken to depend upon the device geometry. Spatially controlled magnetic fields are produced by currents in one or more controlling elements, shown in FIG. 2 as superconductors running closely parallel to their associated junctions. The total field strength at each junction, and thus the state of that junction, is determined by the algebraic sum of its control currents. The constant-voltage output of one Josephson device may provide a known current input to another such device with a resistor which retains ohmic characteristics at the cryogenic temperatures employed. The resistors also prevent transmission-line reflections which would otherwise be produced by the extremely high switching speeds of these devices. Josephson devices and their interconnections are known to the art, as shown, for example in Matisoo, "The Tunneling Cryotron — A Superconductive Logic Element Based on Electron Tunneling", *Proceedings of the IEEE*, Vol. 55, pp. 172–180 (Feb. 1967).

In FIG. 2, the analog current to be converted is introduced on line 201, and is removed on line 202. This signal may be provided by, e.g., a conventional sample-and-hold circuit (not shown). Line 201 is a control line associated with four Josephson devices, G3, G2, G1 and G0, all of which may be assumed to switch to a voltage-drop state at a total gate current of 7.5 current units, i.e., $7.5 \times Iu$. Devices G3-G0 collectively form a comparison means.

Line 211 of a first conversion stage 210 provides junction current to device G3 at time t0. Device G3 is appropriately biased by control line 216 to establish the desired threshold. If the input current on line 201 is less than 7.5 units, G3 remains in its zero-voltage state. If it is greater than this threshold, G3 switches and a voltage drop appears across G3. Resistor 212 then produces a controlled current in line 213, which forms a control line for Josephson devices D3 and S2. This current is sufficient to switch device D3, which provides a digital 1 voltage output on lines 214. Resistor 215 merely terminates these lines, to prevent reflections of the switching transients. Line 203 provides current to output device D3 (and to output devices D2, D1 and D0) at all times during the conversion cycle.

The current produced in line 213 when G3 switches is also great enough to switch the junctions of Josephson device S2, which, along with devices S1 and S0 form a subtraction means. This device receives current during the entire conversion cycle from line 204. Devices S1 and S0 cannot have a voltage drop at time t0, and device S2 contains a group of four junctions. The values of resistors 205 and 206 are selected relative to the combined voltage drops of the junctions of S2 such that a subtraction line 207 carries the equivalent of 8 current units when S2 is activated by line 213. At time t0, then, line 207 carries no current when the input current is less than 7.5 units, but it carries the equivalent of 8 units when the input current exceeds 7.5 units.

In the second conversion stage 220, comparison device G2 receives control current from lines 201 and 207, and a bias current on line 226. When the junction of G2 receives current on line 221 at time $t1$ later than $t0$, there will be a voltage drop across this junction if the net gate current exceeds a fixed threshold. As shown by the arrow on line 204, the current direction in line 207 opposes the current in the analog input line 201. If the digital output from stage 210 is a 0, there will be no current in line 207, as described hereinabove. In that case, the full input current influences the junction of G2; this situation corresponds to block 102 in FIG. 1. But, if the output of stage 210 is a 1, the current in line 207 is effectively subtracted from the input current at device G2, to perform the function of block 103, FIG. 1. If device G2 is identical to G3, this current represents 8 current units. But, under these conditions, the junction of device G2 will switch when the net control current exceeds 7.5 current units, whereas it is desired to switch G2 at 3.5 units. In order to lower the effective threshold, line 226 carries a fixed bias current which aids the current in line 201. If the bias current is made equivalent to 4 current units, then this current provides 4 of the 7.5 units required to activate G2. Therefore, the net current in lines 201 and 207 need be only 3.5 units in order to switch G2, fulfilling the conditions of block 104, FIG. 1.

If device G2 remains in its zero-voltage state at time t1, the second output bit, on lines 224, is a digital 0. But, if G2 has been switched by the current in lines 201, 207 and 226, then line 223 carries a current whose magnitude is controlled by resistor 222. This current suffices to activate device D2, producing a digital 1 output on lines 224. As in stage 220, a terminating resistor 225 matches the impedance of these lines, to prevent reflections.

Line 223 also serves as a control line for a group of two Josephson junctions S1. The presence of current in line 223 also activates S1. Since S1 and S2 are in series in line 204, and since the activation of S2 produces 8 equivalent units of current in line 207, the activation of S1 introduces 4 units into line 207. At time $t1$, then, line 207 carries 4 current units if device S1 alone is active, 8 units if device S2 alone is active, and 12 units if both devices are active. The addition of the extra 4 units to line 207 has no effect upon the state of device G2, since it has already switched to the voltage state.

A third conversion stage 230 is constructed similarly to the second stage 220. Line 231 supplies device G1 with current at time $t2$ later than $t1$ in the conversion cycle. Assuming that the threshold of G1 is also 7.5 current units, bias line 236 supplies 6 current units of gate current, so that a net current of 1.5 units in lines 201 and 207 is effective to switch the junction of G1 from zero voltage to a constant voltage. As stated previously, line 207 carries 0, 4, 8 or 12 current units at time $t3$. If this current, plus the input and bias currents are sufficient to activate G1, then the resulting current through resistor 232 and line 233 activates device D1 to produce a digital 1 signal at lines 234, across terminating resistor 235.

A current in line 233 also activates single-junction device S0, which introduces two additional current units into line 207, as per block 109 of FIG. 1. The 8 possible currents on line 207 are now 0, 2, 4, 6, 8, 10, 12 and 14, corresponding to the digital outputs at lines 214, 224 and 234. Again, any additional current, resulting from the activation of device S0, cannot affect the state of G1 since it has already switched to the voltage state.

In the final conversion stage 240, device G0 is activated to a voltage-drop state when the net current through lines 201 and 207 exceeds 0.5 current unit, when line 241 receives current at time t3 later than t2. Again assuming identical geometry, the effective threshold of G0 may be lowered from 7.5 to 0.5 by a seven-unit bias current in line 246. The current produced in line 243 through resistor 242, by the activation of G0, produces a digital 1 for the least significant bit on lines 244, across resistor 245. Stage 240 does not add any further current to line 207.

It should be noted at this point that converter 200 requires a relatively small number of Josephson devices. Moreover, none of the devices requires more than three control lines, regardless of the number of stages employed. This latter aspect is important in assuring that every control line can be placed to exert the required control over its associated junction, and in reducing the size of the devices.

Figure 3:
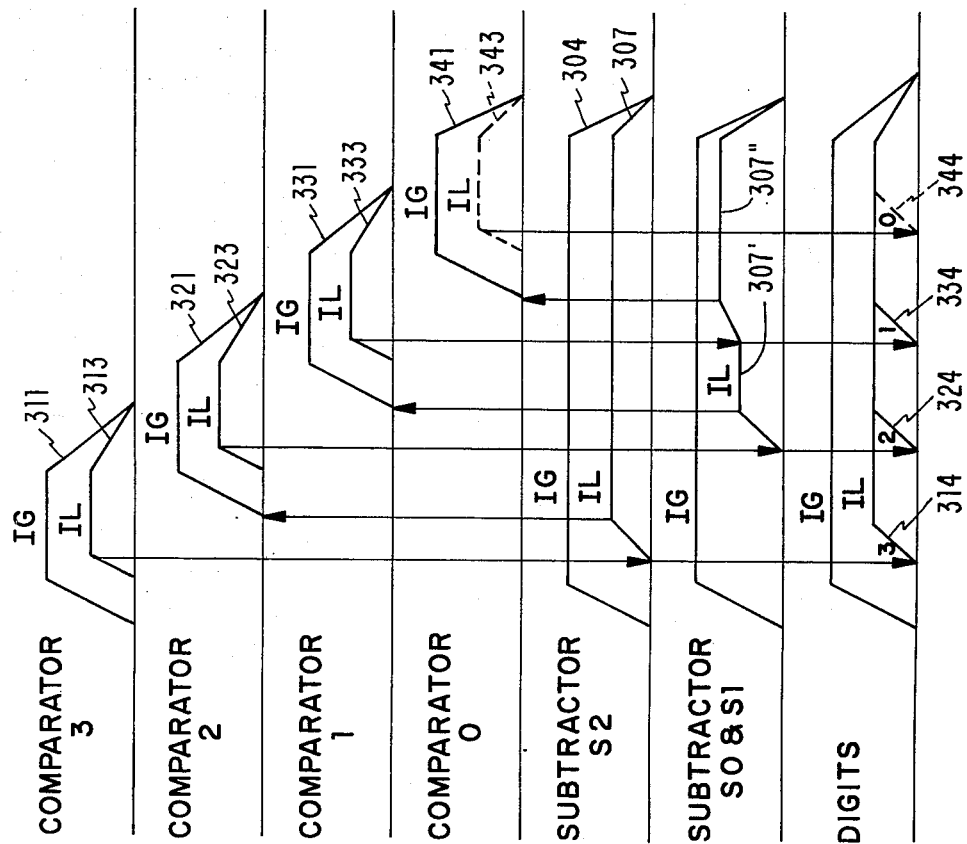
FIG. 3 is a diagram illustrating various signal magnitudes for a particular analog input signal to the converter of FIG. 2.

FIG. 3 illustrates the operation of converter 200 for an exemplary current input of 14 units. Reference numeral 311 indicates the junction current which passes from line 211 through comparison device G3 in FIG. 2. Since the input current exceeds 7.5 units, device G3 produces a current 313 on line 213, FIG. 2. This current in turn produces an output voltage 314 on lines 214. It also causes 8 units of current 307 to flow in line 207, since the junctions of subtraction device S2 are provided with junction current 304 throughout the conversion cycle. When comparison device G2 is provided with junction current 321, output 323 indicates that the 14-unit input current, less the eight-unit subtraction current 307, is greater than 3.5 units of current. Thus, an output voltage 324 is produced for the second bit, and subtraction device S1 adds a four-unit current 307' to the eight-unit current 307. The resulting 12 units of current oppose the 14-unit input, but the difference is still greater than the 1.5-unit effective threshold of comparison device G1. Thus, when G2 receives junction current 331, its output current 333 produces a voltage 334, and causes subtraction unit S0 to add 2 further units of current 307'' to line 207, FIG. 2, making 14 units altogether. When comparison device G0 receives junction current 341, the difference between the 14-unit input and the 14-unit subtraction current is not sufficient to overcome the 0.5-unit effective threshold of comparison device G0 Hence it produces no output current and no digital output voltage, as indicated by the dashed lines 343 and 344. The four digital output voltages 314, 324, 334 and 344 are then 1110, or binary 14, representing the 14 units of input current.

What is claimed is:

1. A successive-approximation analog-to-digital converter for an analog input signal, comprising:

comparison means having a plurality of Josephson junctions adapted to switch to a voltage-drop state at predetermined control-signal levels for producing comparison signals, and control means for applying said input signal and a subtraction signal for controlling certain of said junctions, subtraction means having a plurality of further Josephson junctions disposed in groups, and further control means for applying said comparison signals to respective ones of said groups for producing said subtraction signal as a function of the number of said further junctions in said voltage-drop state, and output means coupled to said comparison means for producing digital signals representing the magnitude of said analog input signal.

2. The converter of claim 1, wherein said further junctions are connected in a single series circuit, and wherein said subtraction signal is related to the total voltage drop across said series circuit.

3. The converter of claim 2, wherein the control means of said comparison means includes a first line for applying an input current representing said analog input signal to said junctions, and a second line for applying a subtraction current representing the total amount of said subtraction signal to said junctions.

4. The converter of claim 2, wherein said output means includes a plurality of additional Josephson junctions and additional control means for applying said comparison signals to said additional junctions.

5. The converter of claim 3, wherein said input current and said subtraction current flow in opposite directions, such that said subtraction current increases the effective amount of said input current required to switch said junctions.

6. The converter of claim 3, wherein the control means of said comparison means further includes third lines for applying fixed bias currents to said junctions, such that said bias currents decrease the effective amount of said input current required to switch said junctions.

7. A successive-approximation analog-to-digital converter comprising:

comparison means having at least a single Josephson junction adapted to switch to a voltage drop state at at least a single predetermined analog signal level for producing at least a single comparison signal, means for applying an analog signal to said at least a single junction, subtraction means responsive to the switching to the voltage state of said at least a junction to render said junction responsive to at least another level of input signal including a plurality of groups of Josephson devices and control line means electrically connected to said plurality of groups of Josephson devices and to said at least a single Josephson junction, and means connected to said at least a junction for generating an output signal.

* * * * *